(12) United States Patent
Carbonne et al.

(10) Patent No.: US 9,644,997 B2
(45) Date of Patent: May 9, 2017

(54) AUTOMATIC CALIBRATION METHOD FOR A MOTOR VEHICLE A CAMSHAFT SENSOR

(75) Inventors: Laure Carbonne, Toulouse (FR); Marie-Nathalie Larue, Corronsac (FR); Olivier Marle, Deyme (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 621 days.

(21) Appl. No.: 14/235,260

(22) PCT Filed: Jul. 20, 2012

(86) PCT No.: PCT/EP2012/003084
§ 371 (c)(1),
(2), (4) Date: Mar. 18, 2014

(87) PCT Pub. No.: WO2013/017211
PCT Pub. Date: Feb. 7, 2013

(65) Prior Publication Data
US 2014/0195186 A1    Jul. 10, 2014

(30) Foreign Application Priority Data
Aug. 4, 2011 (FR) ...................... 11 02448

(51) Int. Cl.
*G01D 5/14* (2006.01)
*G01R 33/09* (2006.01)
(Continued)

(52) U.S. Cl.
CPC ............. *G01D 18/00* (2013.01); *G01D 3/032* (2013.01); *G01D 5/145* (2013.01); *G01M 15/06* (2013.01); *G01R 33/091* (2013.01); *G01R 33/093* (2013.01)

(58) Field of Classification Search
CPC combination set(s) only.
See application file for complete search history.

(56) References Cited

U.S. PATENT DOCUMENTS 6,509,731 B1 * 1/2003 Enzendorfer et al. ........ 324/173
6,967,477 B1   11/2005 Murdock et al.
(Continued)

OTHER PUBLICATIONS

International Search Report, dated Aug. 29, 2012, from corresponding PCT application.

*Primary Examiner* — Huan Tran
(74) *Attorney, Agent, or Firm* — Young & Thompson

(57) ABSTRACT

An automatic calibration method for a motor vehicle camshaft sensor, the vehicle having at least one camshaft, a toothed encoded target (or magnetic encoder) associated with this camshaft, and a magnetic field sensor placed near the target to detect magnetic field variations caused by the passage of the teeth of the target near the sensor, the sensor delivering signals corrected by a predetermined detection threshold K, the method including: continuously measuring the value of the magnetic field during at least one revolution of the target, determining the maximum amplitude $A_{max}$ of the field measured during this revolution, determining the minimum amplitude $A_{min}$ of the field measured during this revolution, finding the ratio of the amplitudes $$\frac{A_{min}}{A_{max}}$$

and determining an auto-adaptive correction coefficient K' to be applied to the signal received from the magnetic sensor, with allowance for the geometrical imperfections of the target, according to the following formula:

(Continued)

$$K' = \frac{A_{min}}{A_{max}} \times K.$$

10 Claims, 3 Drawing Sheets (51) Int. Cl.
*G01D 18/00* (2006.01)
*G01D 3/032* (2006.01)
*G01M 15/06* (2006.01)

(56) References Cited

U.S. PATENT DOCUMENTS

| 8,076,927 B2 * | 12/2011 | Ausserlechner et al. ......... 324/207.21 |
| 2009/0001965 A1 | 1/2009 | Ausserlechner et al. |
| 2013/0092114 A1 * | 4/2013 | Pietsch et al. ............. 123/90.17 |
| 2015/0169984 A1 * | 6/2015 | Newton et al. ........ G01R 33/09 |
| 2015/0331070 A1 * | 11/2015 | Koeck et al. .......... G01R 33/09 |

* cited by examiner

AUTOMATIC CALIBRATION METHOD FOR A MOTOR VEHICLE A CAMSHAFT SENSOR

The present invention relates to an automatic calibration method for a motor vehicle camshaft sensor. More specifically, it relates to the automatic determination of the "out-of-roundness" of a toothed wheel (also called the target) mounted at the end of a camshaft of a motor vehicle engine.

BACKGROUND OF THE INVENTION

Camshaft sensors are used in motor vehicles to determine the positions of the various cylinders in the combustion cycle of the engine; in other words, to determine whether the intake stroke, the compression stroke, the explosion stroke or the exhaust stroke is taking place in each cylinder. Sensors of this type include a magnetic field generator (such as a permanent magnet), a magnetic field detection means (for example a Hall effect cell, a magnetoresistive (MR) cell, a giant magnetoresistive (GMR) cell, or other type), and an electronic circuit for processing the signal received by the magnetic field detection means. These sensors, called active sensors, deliver a digital signal to a central computer for processing.

The magnetic field generator may also be the target, made of a magnetic material and having alternating south and north poles. In this case, the sensor may or may not incorporate a permanent magnet, depending on the detection means used. In the following text, the south and north poles are considered to be equivalent to the teeth and intervals of a mechanical target.

A camshaft sensor is associated in a known way with a target fixed to a camshaft. This target takes the form of a disk having a toothed periphery. These teeth all have the same height, but different spacings (intervals) and lengths, thereby providing a means (known in itself) of encoding the positioning of the cylinders in the combustion cycle of an internal combustion engine for a motor vehicle.

The magnetic field detection means present in the sensor detects the passage of the teeth of the target in front of the sensor, and the resulting signal can be used to determine the position of each cylinder with respect to the combustion cycle of the engine, in a known way.

The position of each cylinder in the engine cycle is determined by observing the curve of variations of the magnetic field sensed by the camshaft sensor during one revolution of the target. This curve has a succession of peaks, each corresponding to one tooth of the target. By measuring the spacing between each peak and the next, and the duration of each of them, the position of each cylinder can be determined with respect to the engine combustion cycle. For this purpose, it is therefore important to ensure the accuracy of the position of the electrical edges of the signal generated by the sensor relative to the position of the mechanical edges of the target. Each of its electrical edges represents the passage of the target mechanical edges. The aim is to minimize the phase shift of the signal caused by the variable spacing between the sensor and target. The electrical signal generated by the sensor changes state (high or low) when the magnetic signal crosses a predetermined threshold proportional to its amplitude. For this purpose, this threshold is set (at 75%, corresponding to an optimum level in respect of the accuracy of the electrical edges relative to the mechanical edges for most existing targets) in order to determine the instant of passage of each edge defining a tooth. Thus, as soon as a first maximum and a first minimum of the sensed magnetic field are detected, the threshold value corresponding to 75% of this amplitude is identified, and it is assumed that a falling edge is detected if the measured value of the magnetic field falls below this threshold value, and conversely a rising edge is detected if the measured value of the magnetic field rises above this threshold value (or vice versa). By this means, the moment of detection of the edge is optimized. However, this method presupposes that all the teeth have the same height and that there is no geometrical discrepancy between the various teeth. It therefore presupposes that the geometry of the target is virtually perfect.

However, these systems (of sensors and target) have the drawback of being sensitive to the positioning of the target on the camshaft and to the geometry of this target.

For reasons of cost, the targets, which are simple metal components having teeth of predetermined sizes at predetermined spacings, are serially produced and often have an imperfect geometry. Notably, the teeth do not always have the same height with respect to the center of the target. This defect is called "out-of-roundness". The result of this is that the upper parts of the target teeth are not all located on the same circle centered on the camshaft. This problem is therefore termed "out-of-roundness". This out-of-roundness of the target manufacturing may be accompanied by an out-of-roundness due to the assembly of the target on the camshaft.

Clearly, since the camshaft sensor measures the variations of the magnetic field created by the passage of the teeth in front of it, if a tooth is lower (or higher) than the others, the spacing between this tooth and the sensor varies relative to the other teeth and causes a variation of the sensed magnetic field. These variations of magnetic fields may falsify the measurements made (by decreasing the accuracy of the position of the electrical edges relative to the mechanical edges), or may even fail to be interpreted by the sensor (where a tooth is undetected because the magnetic field is below the detection threshold). The signal delivered by the camshaft sensor is then erroneous, and the determination of the position of each cylinder in the engine cycle is distorted, or may even be impossible to carry out correctly.

US 2009/0001965 describes a magnetic field sensor and a method for calibrating this sensor in which the variations of the magnetic field caused by the rotation of a target are continuously measured in order to determine the received maximum and minimum magnetic fields values. However, this method cannot compensate for incorrect positioning (or for an incorrect geometry of the target), since the calculation of the switching threshold values does not detect these anomalies.

For its part, U.S. Pat. No. 6,967,477 describes an auto-adaptive toothed wheel sensor. However, this sensor does not detect errors in the positioning or geometry of toothed wheels.

SUMMARY OF THE INVENTION

The object of the present invention is to automatically determine the out-of-roundness of a target so as to calibrate the magnetic field detection means, in order to allow for this out-of-roundness and thus deliver a corrected measurement (with greater accuracy of the electrical edges relative to the mechanical edges and with the elimination of the risk of non-detection of a tooth) to the central computer responsible for determining the position of each cylinder in the engine cycle.

A further object of the invention is to determine the out-of-roundness that may appear in a target as a result of its ageing in the engine environment, and to automatically calibrate the sensor associated with this target, in order to allow for this out-of-roundness due to ageing.

For this purpose, the present invention proposes an automatic calibration method for said engine having at least one camshaft, a toothed encoded target associated with this camshaft, and a magnetic field sensor placed in the proximity of the target to detect magnetic field variations caused by the passage of the teeth of the target in the proximity of the sensor, said sensor delivering an electrical signal representing teeth and intervals of the target as a function of a predetermined detection threshold K which is a function of the amplitude of the magnetic field, said method consisting of continuously measuring the value of the magnetic field during a time corresponding to at least one revolution of the target, said method being characterized in that it also consists of:

determining the maximum amplitude $A_{max}$ of the field measured during this time, by determining:
the minimum value $B_{min}$ of the field received by the sensor during at least one revolution of the target,
the maximum value $B_{max-max}$ of the field received by the sensor during at least one revolution of the target,
the difference between the maximum value $B_{max-max}$ of the field received for the set of teeth and the minimum value $B_{min}$ of the field received during at least one revolution of the target, and determining the minimum amplitude $A_{min}$ of the field measured during this time, by determining:
the minimum value $B_{min}$ of the field received by the sensor during at least one revolution of the target,
the minimum value $B_{max-min}$ of the maximum field for the set of teeth during at least one revolution of the target, and
the difference between the minimum value $B_{max-min}$ of the field received and the minimum value $B_{min}$ of the field received during at least one revolution of the target, and determining the auto-adaptive threshold K' of the detection of the teeth and intervals of the target, to be applied to the signal received from the magnetic sensor, with allowance for the geometrical and/or assembly imperfections of the target, according to the following formula:

$$K' = \frac{A_{min}}{A_{max}} \times K.$$

Thus it is apparent that, in order to determine the out-of-roundness (in other words the defects due to geometry and assembly), it is simply necessary to measure the maximum and minimum amplitudes of the magnetic field sensed during the passage of the teeth during at least one revolution of the target, to determine the ratio thereof, and to correct the fixed detection threshold value K used previously by multiplying it by this amplitude ratio.

Therefore it is possible not only to correct a geometrical defect present in a target at the moment of its initial mounting, but also to detect and correct this geometrical defect whenever it appears (thus responding to the problem of the target ageing during its use).

According to the invention, the auto-adaptive detection threshold is calculated automatically. Advantageously, this calculation can be performed either continuously or when the sensor is switched on.

The maximum amplitude and minimum amplitude of the signal during one revolution of the target are advantageously determined by continuously measuring the magnetic field during the passage of each tooth in front of the sensor. The minimum field during one revolution of the target, sensed during the passage of an interval in the proximity of the sensor, is used to determine the maximum and minimum amplitudes. These amplitudes are indeed defined as the difference between the maximum or minimum field sensed during the passage of a tooth in front of the sensor and the minimum field sensed during the passage of an interval in the proximity of the sensor.

Advantageously, the detection threshold for a target having no geometrical defect is set at 75% (or any other fixed value, depending on the geometry of the target). This optimum detection threshold must be such that the sensor electrical response supplied in respect of the target (in relation to the electrical edges) shows virtually no variation as a function of the spacing between the sensor and the target for a target having no geometrical defect. If the target has a geometrical defect, this detection threshold is replaced by a corrected detection threshold which allows for the out-of-roundness.

BRIEF DESCRIPTION OF THE DRAWINGS

Other characteristics and advantages of the present invention will be more clearly understood from a perusal of the following description, provided (by way of non-limiting example) with reference to the attached figures, in which.

DETAILED DESCRIPTION OF THE PREFERRED EMBODIMENTS

In the embodiment described and illustrated in FIGS. 1 to 4, a camshaft sensor 10 has a ferromagnetic element 11 and a magnetic field detection means 12 (such as a Hall effect cell). This sensor 10 delivers a digital signal to a central computer 13.

Figure 1:
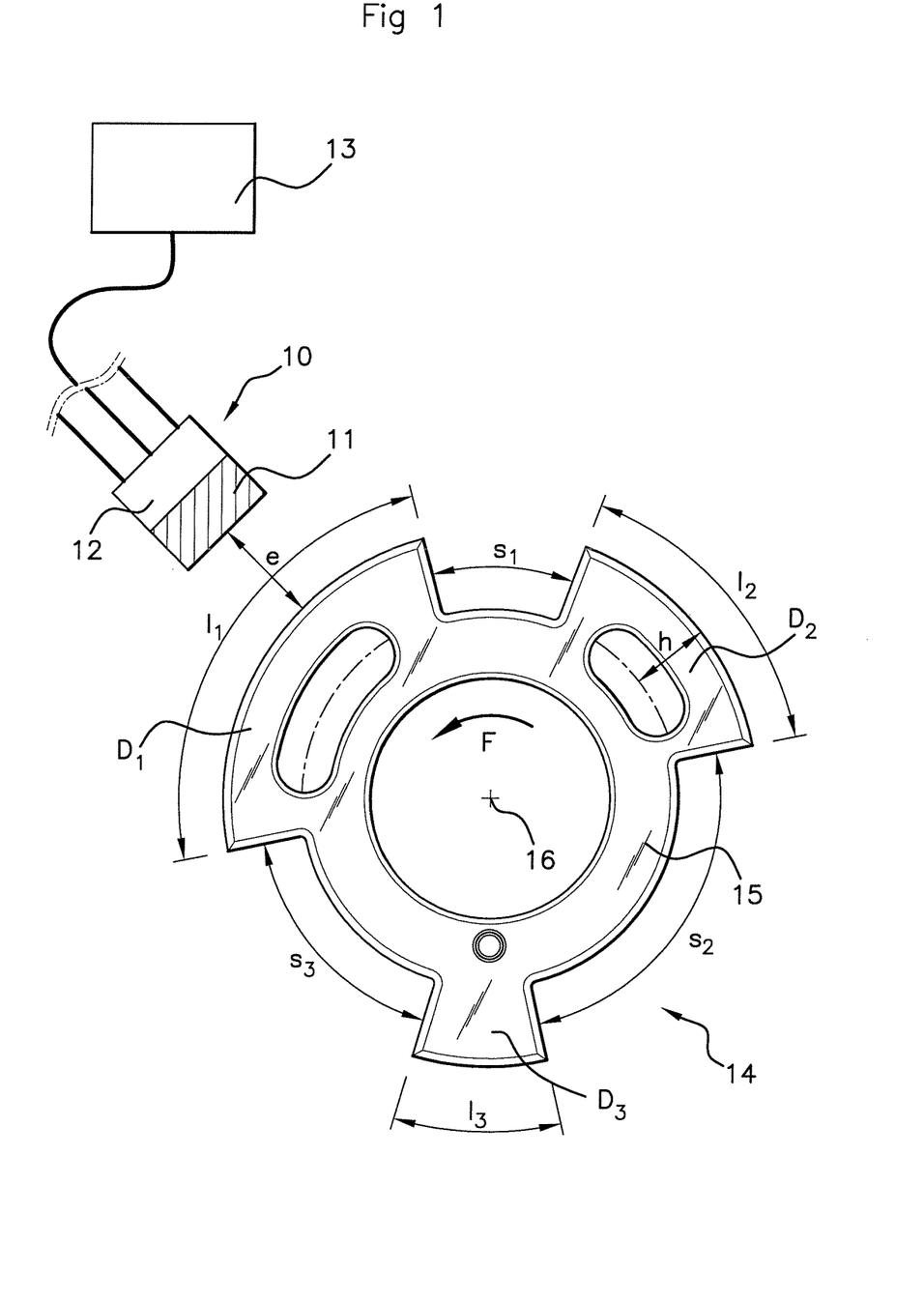
FIG. 1 is a schematic sectional view showing a camshaft sensor and the associated target.

A target 14 associated with this sensor 10 takes the form of a metal disk 15 fixed to a camshaft 16. This target carries on its periphery a plurality of teeth $D_1$, $D_2$, $D_3$ (of which there are three in the illustrated example) having identical heights h (when the target has a perfect geometry) but having variable lengths $l_1$ to $l_3$ and spacings (intervals) $s_1$ to $s_3$. These variable lengths and spacings form a code in a known manner.

The operation of this sensor and target assembly is described below.

Figure 2:
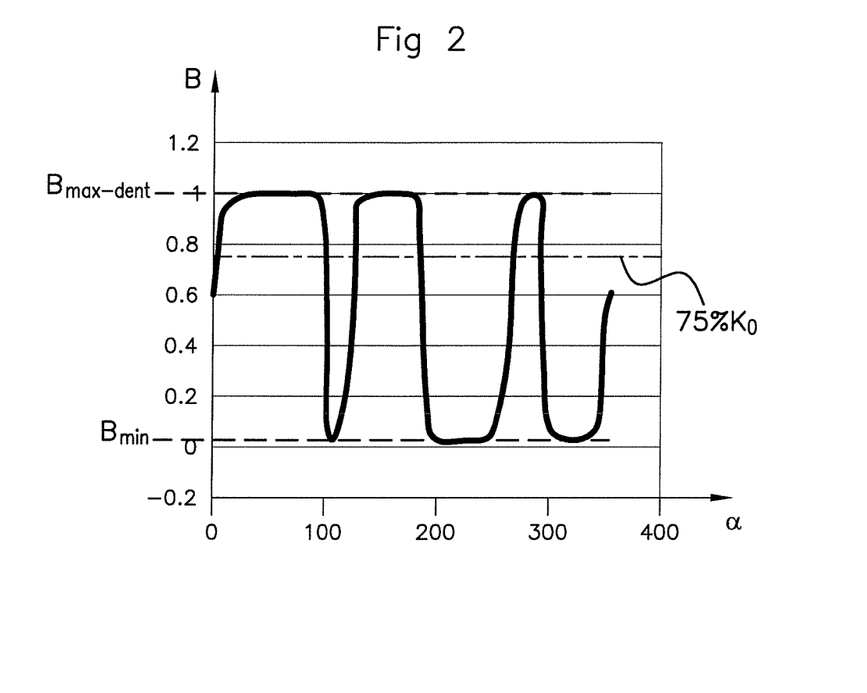
FIG. 2 shows an example of curves of variation of the magnetic field sensed by a sensor associated with a target having no geometrical and/or assembly defect, these curves being normalized with respect to the gap (the space between the sensor and the teeth of the target)

When the target 14 is rotated (arrow F, FIG. 1) by the camshaft 16, the sensor 10 senses a sequence of variations of the magnetic field representing the length l of the teeth passing in front of it and their spacing s. The curve obtained in this way is shown in FIG. 2.

In this figure, the horizontal axis shows the angles α of the engine cycle varying from 0° to 360°, and the vertical axis shows the value B of the sensed magnetic field (the field being normalized as a function of the gap). In the case shown in FIG. 2, all the teeth have the same height and the target has no geometrical defect. Consequently, the maximum field $B_{max-dent}$ sensed by the sensor during the passage of each of the teeth is the same for all three teeth. In the illustrated example, the value of this field is 1. FIG. 2 shows three passages of teeth, the first two being relatively close together, with the first wider than the second, while the passage of a third tooth is narrower and farther from the second tooth. This corresponds to the geometry of the target shown in FIG. 1.

If the geometry of the target is perfect (as in the case of FIG. 2) there is a known way of detecting the passage of a tooth edge as soon as the sensed magnetic field rises above or falls below a predetermined threshold proportional to the maximum sensed amplitude of the field (75% of $B_{max-dent}$–$B_{min}$, for example). This threshold value (the optimum detection threshold, $K_0$) of the sensed field is indicated by a broken line in FIG. 2.

However, the target associated with the camshaft may have geometrical imperfections. Notably, the target may have a degree of out-of-roundness; in other words, it may have teeth whose height h is not identical. In this case, when the imperfect target is made to rotate, the passage of its teeth in front of the sensor 10 causes variations in the magnetic field such as those shown in FIG. 3. In a similar way to FIG. 2, the horizontal axis of this curve shows the angles α of the engine cycle, while the vertical axis shows the magnetic field B normalized as a function of the gap sensed by the sensor 10.

Figure 3:
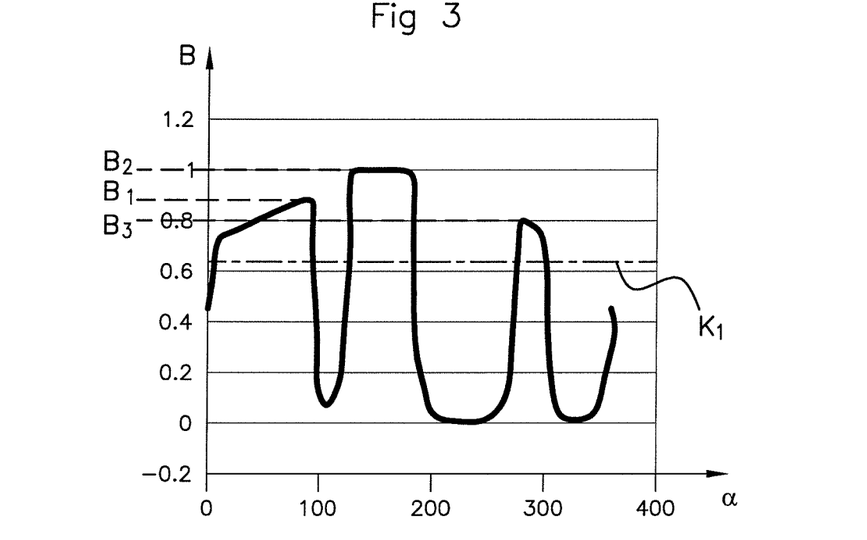
FIG. 3 shows an example of curves of variation of the magnetic field sensed by a sensor associated with a target having a geometrical and/or assembly defect, these curves being normalized with respect to the gap.

In this case, however, it can be seen that the maximum field sensed for each of the teeth $B_{max-dent}$ is not identical throughout the engine cycle (in other words, during one revolution of the camshaft target). In fact, the first tooth is detected with a maximum field $B_1$, the second with a maximum field $B_2$, and the third with a maximum field $B_3$. In the illustrated case, $B_3$ is lower than $B_1$, which is itself lower than $B_2$. In this example, in order to detect the passage of the three teeth correctly, it is necessary to reduce the threshold for the detection of the tooth edges passage to $K_1$=63% of the maximum field. This is because, if this limit was kept at 75% as in the case of FIG. 2, the passage of the third tooth would be undetected.

The problem which arises here is that, if the edge passage detection threshold that is used has a fixed value $K_0$ (as has been the case hitherto), the detection threshold $K_1$ must be set at a lower level than the optimum of $K_0$ in order to detect all the passages of teeth. However, setting a lower value $K_1$ reduces the detection accuracy of the passage of teeth having a correct geometry, since the magnetic field curves diverge as a function of the gap at the point where they pass the detection threshold, which is not the case for an optimum detection threshold (as explained with reference to FIG. 4).

As the detection threshold required to detect the passage of a tooth becomes lower (see the example of $K_2$, set at 30% of the field in FIG. 4), the range of angles [α$_1$, α$_2$] becomes greater. Thus, in the same figure, if $K_4$ is set at 50% of the normalized field, the range of engine angles [α'$_1$, α'$_2$] is notably reduced, whereas if the detection threshold is taken to be $K_0$ (equal to 75%) there is no range of engine angles, but only a single value α (which is therefore highly accurate). Thus, if the detection threshold is about 75%, the angle α does not vary as a function of the gap, whereas if the detection threshold is low ($K_2$, for example) the angle α varies as a function of the gap e.

Figure 4:
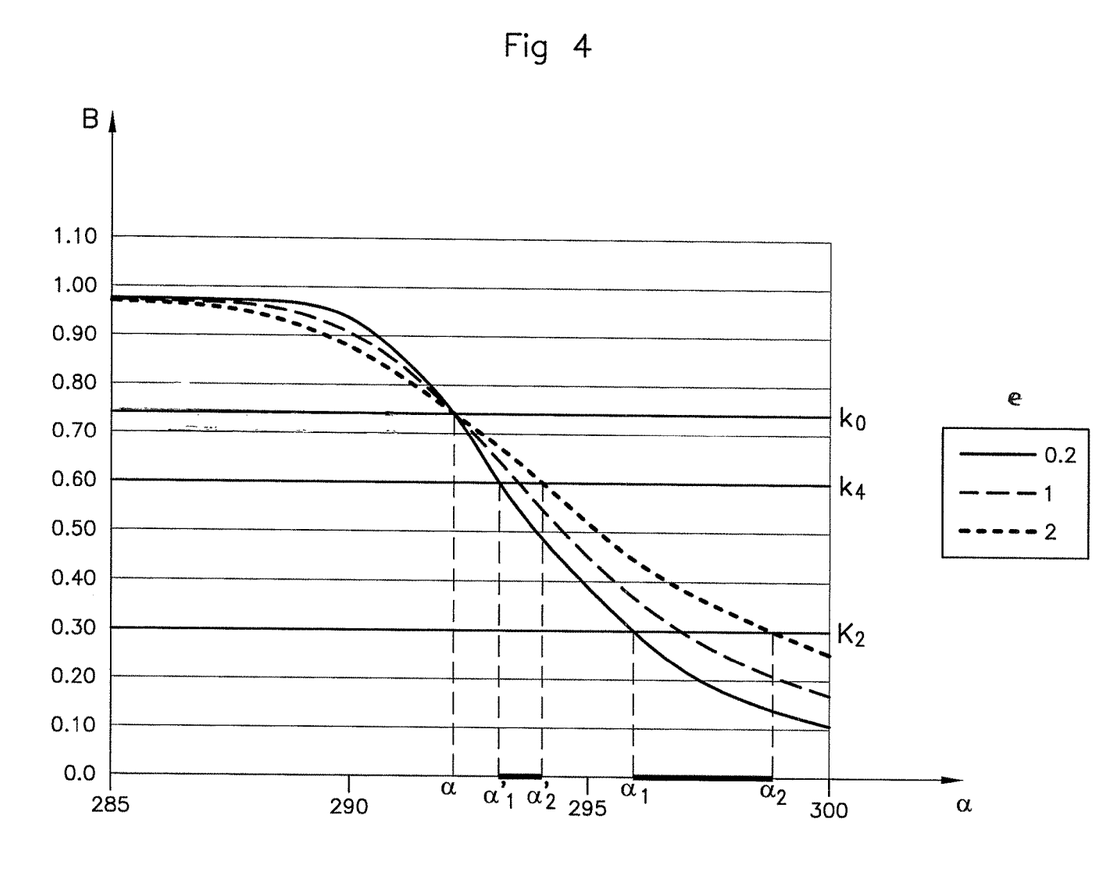
FIG. 4 is a schematic view showing the variation of the angle α of the electrical edge as a function of different gaps e and as a function of the detection threshold.

Therefore, the reduction of the detection threshold to allow the passage of a tooth to be detected (to overcome the problem of imperfect teeth) has an adverse effect on the accuracy of the determination of the engine angle α at the moment of passage of the tooth. The use of a fixed detection threshold for detecting the passage of a tooth is therefore an unsatisfactory solution.

The object of the invention is to automatically calculate a magnetic field detection threshold which can counteract any out-of-roundness, this value being auto-adaptive while still providing the best possible accuracy for the passage detection of the teeth (the electrical signal edge).

To this end, the present invention consists in:

Step 1: Continuously measuring the value of the magnetic field throughout a revolution of the target. In this way the maximum value $B_{max-dent}$ of the magnetic field during the passage of each tooth is continuously determined. Additionally, the maximum value $B_{max-max}$ of the field during the revolution of the target is determined whenever the target has completed a full revolution (or, as a variant, after n full revolutions). This maximum value $B_{max-max}$ is the largest of the values $B_{max-dent}$ measured during one revolution of the target. Similarly, the minimum value $B_{max-min}$ of the maximum sensed field values $B_{max-dent}$ is determined during one revolution of the target.

The minimum value $B_{min}$ of the magnetic field, measured in an interval of the target, during one revolution of the target is also determined.

An example of the measurements made on a target having out-of-roundness and having four teeth is given in the table below:

| K (with no out-of-roundness) | 75% | | | | | |
|---|---|---|---|---|---|---|
| Field (mT) | Sensor/target spacing (mm) | 0.2 | 0.5 | 1 | 1.5 | 2 |
| $B_{max-dent}$ | Tooth 1 | 66.81 | 53.41 | 37.52 | 27.23 | 20.64 |
| | Tooth 2 | 62.14 | 49.82 | 35.00 | 25.61 | 19.55 |
| | Tooth 3 | 52.80 | 42.71 | 30.43 | 22.62 | 17.64 |
| | Tooth 4 | 57.00 | 45.84 | 32.62 | 24.02 | 18.66 |
| $B_{max-max}$ | Over one revolution of target | 66.81 | 53.41 | 37.52 | 27.23 | 20.64 |
| $B_{max-min}$ | Over one revolution of target | 52.80 | 42.71 | 30.43 | 22.62 | 17.64 |
| $B_{min}$ | Over one revolution of target | 4.15 | 4.11 | 3.99 | 3.96 | 3.30 |
| $A_{max}$ | Over one revolution of | 62.66 | 49.30 | 33.53 | 23.27 | 17.34 |

| | | | | | | |
|---|---|---|---|---|---|---|
| K (with no out-of-roundness) | 75% | | | | | |
| $A_{min}$ | target Over one revolution of target | 48.65 | 38.6 | 26.44 | 18.66 | 14.31 |
| $\dfrac{A_{min}}{A_{max}}$ | Over one revolution of target | 0.77 | 0.78 | 0.79 | 0.80 | 0.82 |
| $K' = 75 * \dfrac{A_{min}}{A_{max}}$ | | 57.7% | 58.5% | 59.2% | 60.0% | 61.5% |

Thus it can be seen that, for a spacing (or gap e) of 0.2 mm between the target and the sensor, the maximum value of 66.81 mT sensed by the sensor is that which corresponds to tooth 1, and the minimum of these maximum values is 52.80 mT, corresponding to tooth 3. In the table above, the measurements were made for different spacings e between the sensor and the target. These spacings vary from 0.2 to 2 mm. Admittedly, the measurements were made on a test bench in the case illustrated in this table. If the target is mounted on a vehicle, it is positioned at a predetermined spacing, and only one column of this table need be considered. A further object of this table is to demonstrate the variations of the measured field as a function of the spacing between the target and the sensor.

Step 2: Starting with the measurements and determinations carried out in Step 1, the maximum amplitude $A_{max}$ of the field measured during this revolution of the target is determined. This maximum amplitude is equal to the difference between the maximum value $B_{max-max}$ of the field received for the set of teeth and the minimum value $B_{min}$ of the field received during at least one revolution of the target.

For example, if the spacing between the target and the sensor is 0.2 mm, the maximum amplitude is equal to 66.81-4.15, that is to say 62.66 mT.

Step 3: Starting once again with the measurements and determinations carried out previously, the minimum amplitude $A_{min}$ of the field measured during this revolution of the target is determined. This minimum amplitude is equal to the difference between the minimum value $B_{max-min}$ of the field received and the minimum value $B_{min}$ of the field received during at least one revolution of the target.

For example, if the spacing between the target and the sensor is 0.2 mm, the minimum amplitude is equal to 52.80-4.15, that is to say 48.65 mT.

Step 4: The ratio of the amplitudes $$\frac{A_{min}}{A_{max}}$$

is determined.

For example, if the spacing between the target and the sensor is 0.2 mm, the ratio of the amplitudes $$\frac{A_{min}}{A_{max}}$$

is equal to 0.77.

Step 5: An auto-adaptive detection threshold K' to be applied is determined, with allowance for the geometrical imperfections of the target, according to the following formula:

$$K' = \frac{A_{min}}{A_{max}} \times K.$$

The detection threshold K for the teeth and the intervals of the target is set when the vehicle is first started, to a predetermined percentage of the amplitude. In the case illustrated in the table above, it is initially considered to be 75%, depending on the geometry of the target.

For example, if the spacing between the target and the sensor is 0.2 mm, the threshold K' is equal to 0.77×75, that is to say 57.7%.

If the above table is examined, it will be seen that, in order to measure the magnetic field variations with the maximum accuracy, the detection threshold to be used for the target in question, with a spacing of 0.2 mm between the sensor and the target, is 57.7%, not 75%.

According to the invention, the detection threshold to be applied to a target is calculated automatically. Thus, the measurements made by the magnetic field sensor will always be as accurate as possible, with the least possible impact on the precision of the cylinder phasing angle in the engine cycle.

In subsequent starts of the vehicle, the value of the auto-adaptive detection threshold coefficient K' calculated in the preceding start is used as the fixed threshold for calculating a new auto-adaptive threshold.

It should be noted that this automatic calibration method can be used at each start-up of the vehicle (since it is at this time that it is necessary to know the phasing of each cylinder). Consequently, if any out-of-roundness appears, or varies, as a result of the ageing of the target or of the camshaft, the method according to the invention can be used to automatically recalculate the detection threshold to overcome the effects of this out-of-roundness. This detection threshold is then applied throughout the period of operation of the engine until its next stop.

In a variant, the auto-adaptive threshold K' for the detection of the target teeth and intervals is recalculated at each start-up of the vehicle, and then recalculated after the starting of the vehicle after every target n revolutions and is then updated and applied throughout the period of engine operation until its next stop.

In a variant, the detection threshold K is set at each start-up of the vehicle to a predetermined percentage of the amplitude of the magnetic field received by the sensor.

Clearly, the present invention is not limited to the embodiment described above. For example, the predetermined fixed detection threshold may be different from 75%, without departing from the scope of the present invention. Similarly, the number of revolutions of the target used to calculate $B_{max-min}$, $B_{max-max}$, $B_{min}$, $A_{max}$, $A_{min}$ may be greater than 1. Equally, the calculation does not necessarily have to be performed at the start-up of the vehicle, and may be performed continuously throughout the period of operation of the sensor.

REFERENCE NO 10 sensor
11 indexing element
12 magnetic field detection means
13 central computer
14 target
15 metal disk
16 camshaft
$D_1$ to $D_3$ teeth of the target
e spacing, gap between target and sensor
h height of teeth of the target
$l_1$ to $l_3$ length of teeth
$s_1$ to $s_3$ spacing between teeth of the target
B magnetic field
α engine angle
F (arrow) direction of rotation of the camshaft
[$α_1$, $α_2$]; [$α'_1$, $α'_2$] ranges of the engine angle

The invention claimed is:

1. An automatic calibration method for a motor camshaft sensor of an engine of a vehicle, the engine having at least one camshaft (16), a toothed encoded target (14) associated with said camshaft, said method comprising:
   providing a magnetic field sensor (10) in proximity of the target, the magnetic field sensor (10) configured to detect variations of a magnetic field caused by passage of teeth of the target in proximity of the sensor, said sensor configured to deliver an electrical signal representing teeth and intervals of the target as a function of a predetermined detection threshold K which is a function of an amplitude of the magnetic field;
   providing an electronic circuit in communication with the magnetic field sensor;
   continuously measuring, via said electronic circuit, a value of the electrical signal generated by the magnetic field sensor corresponding to the amplitude of the magnetic field during a time corresponding to at least one revolution of the target;
   determining, by way of a computer apparatus in communication with the electronic circuit, a maximum amplitude $A_{max}$ of the field measured during said time, by determining:
      a minimum value $B_{min}$ of the field received by the sensor during at least one revolution of the target,
      a minimum value $B_{min}$ of the maximum field for the set of teeth during at least one revolution of the target, and
      a difference between the minimum value $B_{max-min}$ of the field received and the minimum value $B_{min}$ of the field received during at least one revolution of the target;
   determining an auto-adaptive threshold K' of the detection of the teeth and intervals of the target, to be applied to the signal received from the magnetic sensor, with allowance for geometrical and/or assembly imperfections of the target, according to formula:

$$K' = \frac{A_{min}}{A_{max}} \times K;$$

and
   automatically determining, at the computer apparatus, an out-of-roundness of the toothed wheel in order to determine a position of each cylinder with respect to a combustion cycle of the engine.

2. The automatic calibration method as claimed in claim 1, wherein the auto-adaptive threshold K' for the detection of the teeth and intervals of the target is recalculated at each start-up of the vehicle, and is then applied throughout a period of operation of the engine until a next stop.

3. The automatic calibration method as claimed in claim 1, wherein the auto-adaptive threshold K' for the detection of the teeth and intervals of the target is recalculated at each start-up of the vehicle, is recalculated after a starting of the vehicle after every n revolutions of the target, and is then updated and applied throughout the period of operation of the engine until a next stop.

4. The automatic calibration method as claimed in claim 1, wherein the threshold K for the detection of the teeth and the intervals of the target is set when the vehicle is first started to a predetermined percentage of the amplitude, and is set at a time of subsequent start-ups to a value of the auto-adaptive correction coefficient K' calculated at a preceding start-up.

5. The automatic calibration method as claimed in claim 1, wherein the threshold K for the detection of the teeth and the intervals of the target is set at each start-up of the vehicle to a predetermined percentage of an amplitude of the magnetic field received by the sensor.

6. The automatic calibration method as claimed in claim 2, wherein the threshold K for the detection of the teeth and the intervals of the target is set when the vehicle is first started to a predetermined percentage of the amplitude, and is set at the time of subsequent start-ups to a value of the auto-adaptive correction coefficient K' calculated at a preceding start-up.

7. The automatic calibration method as claimed in claim 3, wherein the threshold K for the detection of the teeth and the intervals of the target is set when the vehicle is first started to a predetermined percentage of the amplitude, and is set at the time of subsequent start-ups to a value of the auto-adaptive correction coefficient K' calculated at a preceding start-up.

8. The automatic calibration method as claimed in claim 2, wherein the threshold K for the detection of the teeth and the intervals of the target is set at each start-up of the vehicle to a predetermined percentage of an amplitude of the magnetic field received by the sensor.

9. The automatic calibration method as claimed in claim 3, wherein the threshold K for the detection of the teeth and the intervals of the target is set at each start-up of the vehicle to a predetermined percentage of an amplitude of the magnetic field received by the sensor.

10. An automatic calibration method for a motor camshaft sensor of an engine of a vehicle, the engine having at least one camshaft (16), a toothed encoded target (14) associated with said camshaft, said method comprising:
   providing a magnetic field sensor (10) in proximity of the target, the magnetic field sensor (10) configured to detect variations of a magnetic field caused by passage of teeth of the target in proximity of the sensor, said sensor configured to deliver an electrical signal representing teeth and intervals of the target as a function of a predetermined detection threshold K which is a function of an amplitude of the magnetic field;
   providing an electronic circuit in communication with the magnetic field sensor;

continuously measuring, via said electronic circuit, a value of the electrical signal generated by the magnetic field sensor corresponding to the amplitude of the magnetic field during a time corresponding to at least one revolution of the target;

determining, by way of a computer apparatus in communication with the electronic circuit, a maximum amplitude $A_{max}$ of the field measured during said time, by determining:
- a minimum value $B_{min}$ of the field received by the sensor during at least one revolution of the target,
- a minimum value $B_{max-min}$ of the maximum field for the set of teeth during at least one revolution of the target, and
- a difference between the minimum value $B_{max-min}$ of the field received and the minimum value $B_{min}$ of the field received during at least one revolution of the target;

determining, at the computer apparatus, an auto-adaptive threshold K' of the detection of the teeth and intervals of the target, to be applied to the signal received from the magnetic sensor, with allowance for geometrical and/or assembly imperfections of the target, according to formula:

$$K' = \frac{A_{min}}{A_{max}} \times K;$$

and automatically determining, at the computer apparatus, an out-of-roundness of the target so as to calibrate the magnetic field detection sensor, in order to compensate for said out-of-roundness and generate a corrected measurement for determining a position of each cylinder in the engine cycle.

* * * * *